United States Patent [19]
Cline

[11] Patent Number: 5,789,945
[45] Date of Patent: Aug. 4, 1998

[54] METHOD AND CIRCUIT FOR IMPROVING METASTABLE RESOLVING TIME IN LOW-POWER MULTI-STATE DEVICES

[75] Inventor: Ronald L. Cline, Albuquerque, N. Mex.

[73] Assignee: Philips Electronics North America Corporation, New York, N.Y.

[21] Appl. No.: 607,404

[22] Filed: Feb. 27, 1996

[51] Int. Cl.$^6$ .............................. H03K 19/003
[52] U.S. Cl. .............. 326/94; 326/21; 326/93; 327/215
[58] Field of Search .............. 326/21, 93, 94, 326/98; 327/198, 215, 219

[56] References Cited

U.S. PATENT DOCUMENTS

| | | | |
|---|---|---|---|
| 4,963,772 | 10/1990 | Dike | 327/198 |
| 5,001,371 | 3/1991 | Mahabadi | 327/198 |
| 5,036,221 | 7/1991 | Brucculeri et al. | 327/198 X |
| 5,081,377 | 1/1992 | Freyman | 327/198 |
| 5,187,385 | 2/1993 | Koike | 327/198 |
| 5,365,122 | 11/1994 | Rackley | 326/21 X |
| 5,485,112 | 1/1996 | Greenberg et al. | 327/215 X |
| 5,489,865 | 2/1996 | Colvin, Sr. | 326/94 X |

*Primary Examiner*—David R. Hudspeth
*Attorney, Agent, or Firm*—Brian J. Wieghaus

[57] ABSTRACT

A circuit and method for improving the metastable resolving time in low-power multi-state devices, including binary latches in integrated circuits. Upon detection of a metastable condition at the outputs of the integrated circuit, an increase in energy is locally applied to the decision making portion of the circuit. The localized application of energy to the decision making circuit reduces the metastability time constant tau ($\tau$), thereby causing the circuit to resolve more rapidly to a stable operating state.

19 Claims, 2 Drawing Sheets

METHOD AND CIRCUIT FOR IMPROVING METASTABLE RESOLVING TIME IN LOW-POWER MULTI-STATE DEVICES

BACKGROUND OF THE INVENTION

1. Field of the Invention

The present invention relates to latch devices. More particularly, it relates to a method of improving the metastable resolving time in binary or two state latch devices.

2. Prior Art

In practice, metastability is where a bistable element such as, for example, a latch device or flip-flop, requires an indeterminate amount of time to generate a valid output. This phenomenon occurs in systems where the input data changes randomly with respect to the system clock. In other words, it is an attempt to synchronize the system clock with an asynchronous input. The time it takes for the device to resolve to stable state depends on the metastability time-constant tau ($\tau$). Tau is the primary term used to determine the MTBF, or Mean Time Between Failure. Another term used in this determination is $T_0$ (T zero). These parameters are generally empirically measured by performing bench tests of the device, and arriving at a suitable curve for clock-to-output delays versus frequency-of-occurrence.

Prior research and studies have determined that the tau ($\tau$) of the circuit is inversely proportional to the transconductance ($g_m$) of the transistors in the latch circuit which is in the metastable state.

Tau ultimately represents "how hard" the circuit is trying to resolve to one of the two stable operating states. As would be expected, much of this depends on technology, for example, the parasitic capacitances in the circuit, the gate lengths of the transistors, etc. "How hard" also means "how much energy is being expended" trying to resolve to one of the two stable operating states. This is reflected in a power-supply related term for tau. Thus, there is a dependence on MOS transistors thresholds for CMOS circuits of the form:

$$\tau \approx \text{Constant}/(V_{supply} - (2)(V_{th}))^n$$

Where:

$V_{supply}$=Supply voltage to the latch circuit n=an exponential factor between 1 and 2

Since $V_{th}$ is in the range of 0.7–1.0 volts for both n-channel and p-channel MOS transistors, "tau" increases dramatically as $V_{supply}$ lowers towards ($2 \times V_{th}$). Since tau is the exponent term of the MTBF, it becomes clear that the MTBF increases radically as system supply voltages approach 1.5–2 volts.

Previous, unsuccessful attempts for improvement of latch metastable resolution have involved detection and then transfer of the decision to yet another latch. These solutions have failed because they simply transfer the problem from one location to another. In this way, the second latch could have the same or other metastability problems.

The present invention addresses the problem of resolving time in latch devices, and shows that the metastable condition can be detected and the circuitry can be changed such that the time needed to resolve to a stable state (i.e., tau) can be significantly reduced, thereby minimizing the MTBF.

SUMMARY OF THE INVENTION

The present invention provides a method and circuit for improving the metastable resolving time in low power integrated circuits. According to the invention, the metastable state of any latch device is detected through circuitry, and a localized increase in power-supply voltage is applied to the decision making circuit. The localized increase in power to the decision making circuit (i.e., latch device) causes the circuit to resolve to a stable operating state faster, and thus reduces the resolving time constant tau of the decision network.

It is therefore an object of the invention to provide a method and circuit for improving metastable resolving time in low power integrated circuits that detects a metastable condition in latch devices.

It is another object of the invention to provide a method and circuit for improving metastable resolving time in low power integrated circuits that locally increases power to the decision making circuit upon detection of the metastable condition.

Yet another object of the invention is to provide a method and circuit for improving metastable resolving time in low power integrated circuits that applies a localized power increase to the decision making circuit without increasing the power consumed by the remaining portions of the circuit.

It is a further object of the invention to provide a method of improving metastable resolving time in low power integrated circuits that operates efficiently and reliably.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

DETAILED DESCRIPTION OF SPECIFIC EMBODIMENTS

Figure 1:
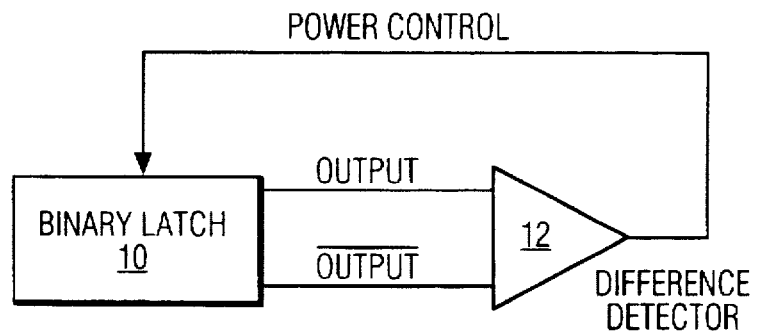
FIG. 1 is a circuit block diagram of the method of improving metastable resolving time according to the invention.

FIG. 1 shows a block diagram of a binary, or 2-state latch device 10 having a difference detector 12 coupled to the outputs. Difference detector 12 has an output that is fedback to binary latch device 10. When the difference detector detects a metastable condition in latch 10, detector 12 provides localized power to the latch device. The application of a localized increase in electrical power to the decision making circuit causes that circuit to resolve to a stable operating state more rapidly than it would under ordinary operating conditions. This concept applies to any physical multi-state memory element or device.

Figure 2:
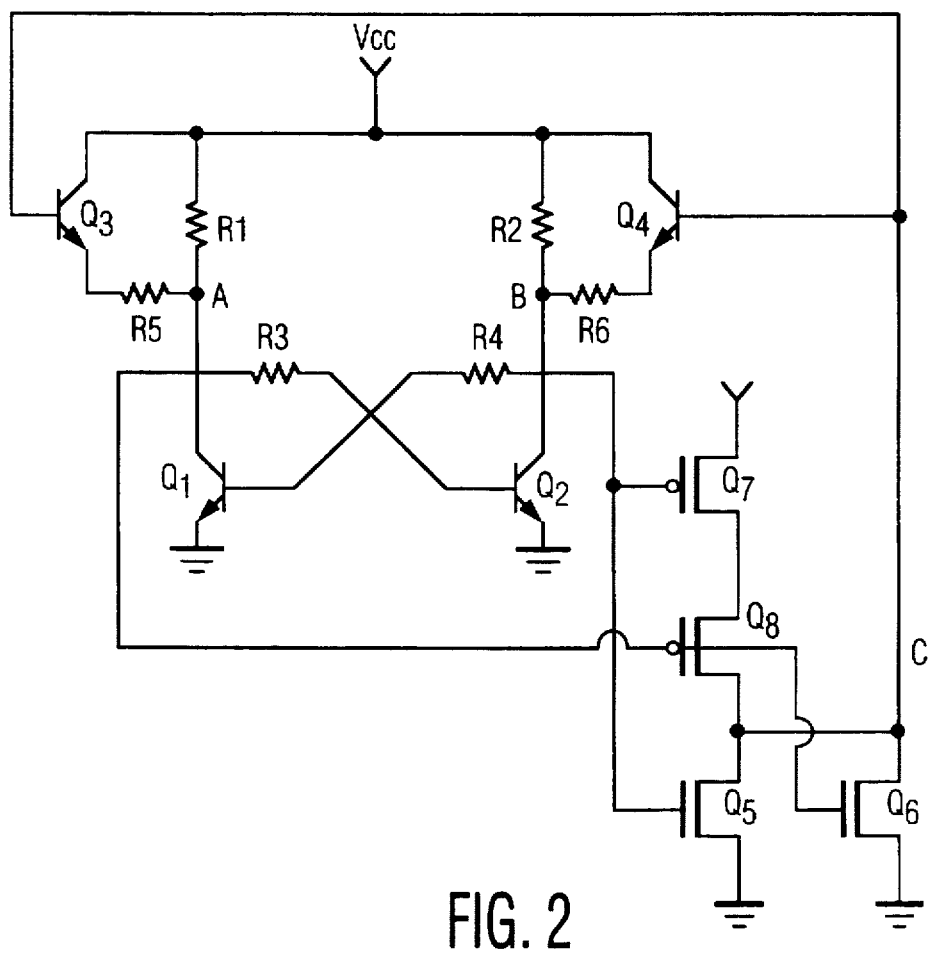
FIG. 2 is a schematic circuit diagram of a first embodiment of the invention.

FIG. 2 shows the first embodiment of the invention, or a BiCMOS circuit version of the invention. This is a direct application of the "more power" theory, that is, detecting the metastable condition, and locally applying more power to the decision making circuit of the latch. The transconductance ($g_m$) of a bipolar transistor is linearly dependent on the collector current.

$$g_m = dIc/dVbe \approx Ic$$

The resolving time constant tau ($\tau$) is reduced when the gain, or transconductance ($g_m$), is increased. Referring to FIG. 2, Bipolar NPN transistors Q1 and Q2 form a crosscoupled latch through resistors R3 and R4, and the supply current is coupled through resistors R1 and R2. The values of R1 and R2 are high enough to maintain the normal operating current of the latch low. During either of the normal states of the latch, transistors Q3 and Q4 are off, so that no current conducts through resistors R5 and R6.

During the normal state of the circuit, either one of the transistors Q1 or Q2 is on, and the other is off. Assuming Q1 is off (i.e., conducting zero current), the voltage at node A will be determined by the resistor divider R1/R3, with the bottom node of R3 at the Vbe voltage of on-transistor Q2 (i.e., approximately 0.8 volts). R3 should be significantly larger that R1. Thus, assuming a 10:1 ratio (e.g., R1 is 1 k ohms, R3 is 10 k), the voltage at R1 is:

$$VA = \frac{((V_{CC} - 0.8) * 10k)}{(1k + 10k)} + 0.8 = 4.62 \text{ volts}$$

(assuming $V_{CC}$ ×5 volts)

The voltage at node B will be determined by the saturation voltage of on transistor Q2, approximately 0.2 volts.

N-channel MOS transistors Q5 and Q6, along with P-channel Q7 and Q8, form a 2-input CMOS NOR gate. The effect of node A being a "high" (4.62 volts) causes the gate output voltage 'C' to be low (0 volts), thus turning off bipolar NPN transistors Q3 and Q4. In this case, no current can flow through resistors R5 and R6.

If the latch (i.e. formed by Q1 and Q2 through R3 and R4), becomes metastable, both transistors Q1 and Q2 are 'on' in the active (non-saturated) region. The base nodes of Q1 and Q2 will both be at 0.8 volts. The current through resistors R3 and R4 will be very low, supplying only the current needed by the transistors in their active state (this is typically ¹⁄₁₀₀th of the collector current). Since R3 and R4 are, in this example, 10 times the value of R1 and R2, the voltage across R3 and R4 will be approximately ¹⁄₁₀th the voltage across R1 and R2, or approximately 0.4 volts. Thus, the voltage at nodes A and B will be approximately 1.2 volts (0.8 plus 0.4) when the latch is in the metastable region.

These values of A and B (approximately 1.2 volts) will be logic "low" inputs to the CMOS NOR gate, which has an input threshold of approximately ½ $V_{cc}$. Thus, the output 'C' will go high (i.e., to $V_{cc}$) turning on transistors Q3 and Q4. This will cause current flow through resistors R5 and R6, which are connected to the latch output nodes A and B. This additional current flow increases the power in the latch and decreases the metastable resolving time. The additional current consumption occurs only in a transient fashion, being removed once either node A or B goes high (causing NOR gate output C to return to a low state).

Figure 3:
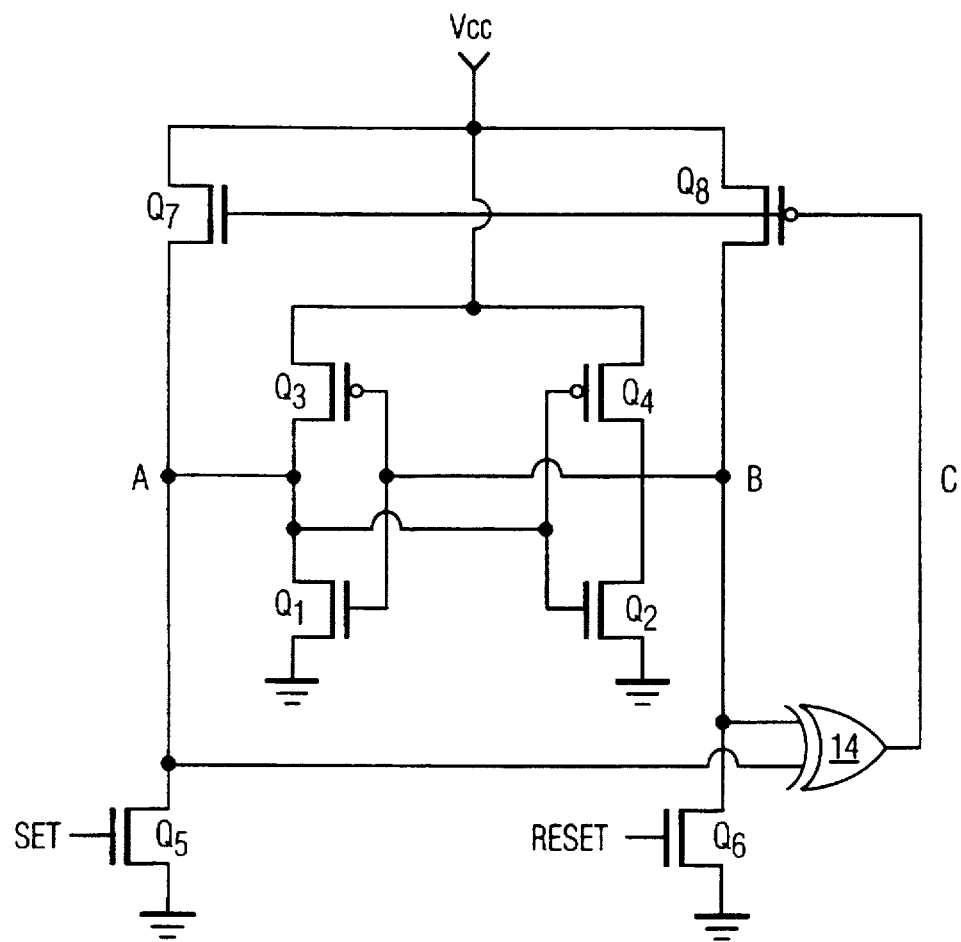
FIG. 3 is a schematic circuit diagram of a second embodiment of the invention.

FIG. 3 shows a second embodiment of the invention. Transistors Q1/Q3 and Q2/Q4 form two back-to-back inverters, creating a binary latch with outputs A and B.

Transistor Q5 has a "set" signal attached to its gate, causing node A to go low when the "set" signal goes high. If node A is initially high, and the "set" signal goes high for a very short duration, node A starts to go low, and causes node B to start to go high through the action of the inverter formed by Q2/Q4. It is then possible for node A and node B to be equal at the point the "set" signal goes back low, causing the latch to go into the metastable state.

The exclusive-OR gate 14 has as its inputs node A and B. The output node C is high only if node A and node B are logically different (i.e., one is high and the other is low). This is normally the case, and p-channel transistors Q7 and Q8 will be off (i.e., non-conducting).

In the metastable state, however, nodes A and B will be the same logical levels, causing Ex-Or gate output node C to go low. This turns on transistors Q7 and Q8 fully (their gate voltages, which are connected to node C, are at ground potential). This contrasts to the other P-channel transistors Q3 and Q4 which have their gate voltages sitting at half-way between $V_{cc}$ and ground, thus having much reduced current.

The increased currents from Q7 and Q8 are fed into the latch output nodes A and B, causing the gate voltages of Q1 and Q2 (which are connected to these nodes) to rise. The higher gate voltages cause Q1 and Q2 to conduct more current (taking the current from Q7 and Q8). This higher-voltage, higher current operating point results in higher transconductance (higher gain) for these transistors, thus increasing the speed at which the latch resolves itself, and thereby lowering tau.

Note that the higher voltages A and B effectively turn off Q3 and Q4, the p-channel transistors in the CMOS inverters. Q7 and Q8 act, in this case, as passive (resistor-type) loads, reducing the effective number of MOS transistors in series between $V_{cc}$ and ground from two to one (CMOS case).

When the latch finishes its resolution, nodes A and B become logically different, causing node C to return to a high level, shutting off Q7 and Q8. The circuit returns to its zero-supply-current CMOS operation.

While several embodiments of the present invention have been shown and described, it is to be understood that many changes and modifications may be made thereunto without departing from the spirit and scope of the invention as defined in the appended claims.

What is claimed is:

1. A circuit for improving metastable resolving time in low-power integrated circuits, the integrated circuits having a decision making portion, inputs for receiving data, and outputs, the circuit comprising:

detection means coupled to the outputs of the integrated circuit for detecting a metastable condition in the circuit; and control means coupled to said detection means and decision making portion for locally increasing the electrical power applied to said decision making portion, without preference to a resulting state of the decision making portion, when the metastable condition is detected.

2. The circuit according to claim 1, wherein said control means comprises:

a feedback channeling circuit coupled to a circuit supply voltage, said channeling circuit applying an increased portion of the supply voltage to the decision making portion.

3. The circuit according to claim 1, wherein said detection means comprises a NOR gate.

4. The circuit according to claim 1, wherein said detection means comprises an Ex-OR gate.

5. A circuit according to claim 1, wherein said control means removes the increased portion of the electrical power when the metastable condition is no longer detected.

6. A method for improving the metastable resolving time in low-power multi-state devices having decision making portions, the method comprising the steps of:

detecting a metastable condition within the circuit; and increasing the electrical power applied to the decision making portion without preference to a resulting state of the decision making portion.

7. The method according to claim 6, wherein said step of coupling comprises a feedback loop coupling a power source with at least one decision making portion of the multi-state device.

8. A circuit according to claim 6, further comprising removing the increased portion of the electrical power when the metastable condition is no longer detected.

9. A circuit for improving metastable resolving time in multi-state devices, the multi-state devices having a decision making portion, inputs for receiving data, and outputs, the circuit comprising:

detection means coupled to the outputs of the multi-state device for detecting a metastable condition in the circuit; and control means coupled to said detection means and decision making portion for locally increasing the electrical power applied to said decision making portion when the metastable condition is detected.

10. A circuit according to claim 9, wherein said control means removes the increased portion of the electrical power when the metastable condition is no longer detected.

11. An integrated circuit, comprising:

a multistable circuit having data inputs and at least one data output, said circuit normally having at least first and second stable conditions in response to data received at said inputs, said multistable circuit having a metastable condition caused by certain other data received at said inputs;

detecting means for detecting the metastable condition in the multistable circuit;

the multistable circuit when in the metastable condition having a resolving time inversely proportional to the electrical power supplied to the multistable circuit, and means, communicating with said detecting means, for supplying a first level of electrical power to said multistable circuit when the metastable condition is not detected and for supplying a second level of electrical power, higher than said first level and without changing the data inputs causing said metastable condition, to said multistable circuit when the metastable condition is detected by said detecting means.

12. A circuit according to claim 11, wherein said multistable circuit is one of (i) a bistable latch circuit and (ii) a flip-flop circuit.

13. A circuit according to claim 11, wherein said means for supplying said first and second levels of electrical power includes a constant voltage source and a first impedance in series with said voltage source for supplying a first level of current to said multistable circuit, and a second impedance and a switch device for electrically coupling the second impedance to the constant voltage source in parallel with the first impedance to supply a second, higher current to said multistable circuit upon detection of the multistable circuit by said detection means.

14. A circuit according to claim 13, wherein said first and second impedances each comprises a resistor.

15. A circuit according to claim 13, wherein said second impedance and switch device are together comprised by a MOSFET.

16. A circuit according to claim 13, wherein said constant voltage source provides a supply voltage of less than about 2 volts.

17. An integrated circuit, comprising:

a multistable circuit having data inputs and at least one data output, said circuit normally having at least first and second stable conditions in response to data received at said inputs, said multistable circuit having a metastable condition caused by certain other data received at said inputs;

detecting means for detecting the metastable condition in the multistable circuit;

the multistable circuit when in the metastable condition having a resolving time inversely proportional to the electrical power supplied to the multistable circuit, and means, communicating with said detecting means, for supplying a first level of electrical power to said multistable circuit when the metastable condition is not detected and for supplying a second level of electrical power, higher than said first level, to said multistable circuit when the metastable condition is detected by said detecting means, said second level of electrical power being supplied irrespective of the output and input data of the multistable circuit and without preference to a resulting state of the multistable circuit.

18. A circuit according to claim 17, wherein said means for supplying said first and second levels of electrical power comprises only one constant voltage source.

19. A circuit according to claim 18, wherein said constant voltage source provides a supply voltage of less than about 2 volts.

\* \* \* \* \*